United States Patent [19]

Uronen et al.

[11] Patent Number: 5,036,432
[45] Date of Patent: Jul. 30, 1991

[54] PLASTIC SHELL STRUCTURE FOR RADIO TELEPHONE

[75] Inventors: Lasse J. Uronen; Matti J. Saarela, both of Salo, Finland

[73] Assignee: Nokia Mobile Phones Ltd., Salo, Finland

[21] Appl. No.: 473,921

[22] Filed: Jan. 31, 1990

[30] Foreign Application Priority Data

Feb. 3, 1989 [FI] Finland .................................. 890540

[51] Int. Cl.$^5$ .............................................. H05K 7/00
[52] U.S. Cl. .................................. 361/422; 174/50; 361/380; 361/394
[58] Field of Search .......................... 174/50; 312/7.1; 361/380, 392, 394, 395, 399, 422, 424; 455/345, 347, 348

[56] References Cited

U.S. PATENT DOCUMENTS

| | | | |
|---|---|---|---|
| 4,631,640 | 12/1986 | Umetsu et al. | 361/422 |
| 4,672,510 | 6/1987 | Castner | 361/394 |
| 4,794,489 | 12/1988 | Brown | 361/395 |
| 4,878,154 | 10/1989 | Wang | 361/395 |

*Primary Examiner*—Gregory D. Thompson
*Attorney, Agent, or Firm*—Darby & Darby

[57] ABSTRACT

The present invention concerns a shell structure for a radio telephone. The shell comprises three parts: a box-like part or base (1), a cover part (3), and a locking part (4) having flexible tongues. A finished tested radio telephone unit may be disposed in the box-like base (1), whereafter the cover part (3) is fixed to the base with a small longitudinal movement, and finally, the locking part tongues are depressed into grooves of the base, in which the tongues become locked, locking simultaneously the cover part (3) to the base. The shell structure enables mounting without using screw connectors, whereby the assembly of the shell structure may be automated.

8 Claims, 1 Drawing Sheet

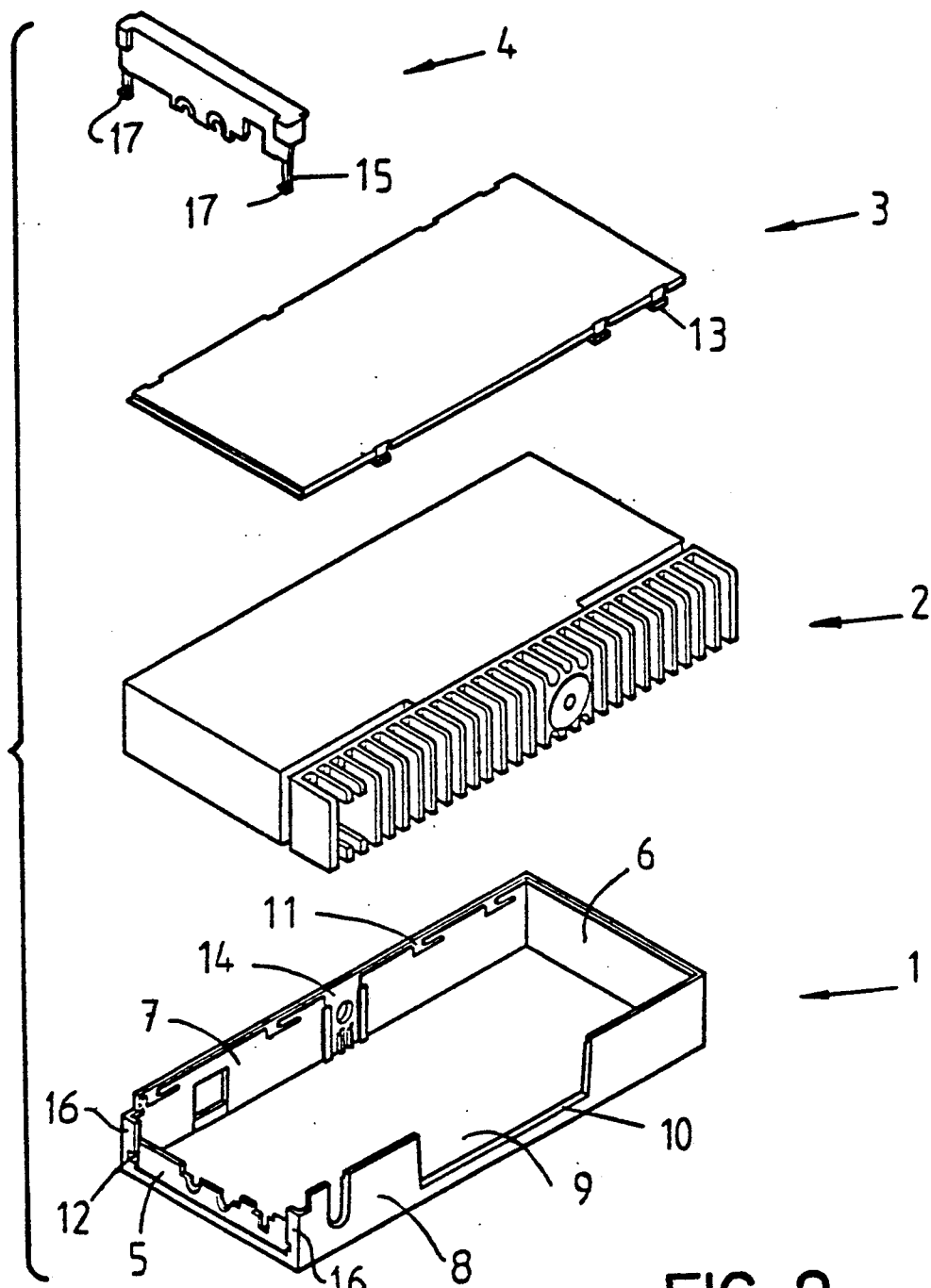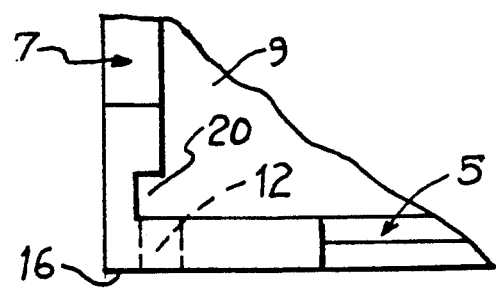

PLASTIC SHELL STRUCTURE FOR RADIO TELEPHONE

BACKGROUND OF THE INVENTION

The present invention concerns a shell of a radio telephone for connecting the radio telephone and the shell together without any screws.

A radio telephone shell usually comprises two or several parts enclosing therein the chassis of a radio telephone with the components attached thereto. The shell parts have been so designed mechanically that they, as closely as possible, are equivalent to the form of the chassis to be enclosed. It is most usual to fix the shell parts to the chassis and to each other with screws, whereby the body part and the various shell parts are provided with suitable threaded counterparts for screws. The material of the shell is most often a metal, e.g. aluminium.

As drawbacks of this kind of designs known in the art, it may be mentioned, for instance, that the shell and the chassis are required to be equivalent to one another to the extent that a given shell matches with a given chassis. Hereby, when various modifications are to be produced, not only a new shell, but also a new chassis with modules attached thereto have to be manufactured, in order to match with said shell. This measure is always time consuming and also increases the costs. The assembly of structures of this kind is also difficult to automate, owing to the screw connectors to be used. All this lengthens the assembly time. If a shell is damaged in use and needs to be replaced, a great number of screw connectors have to be detached first and then the modules have to be detached from the chassis, whereafter they have to be mounted in a new chassis.

SUMMARY OF THE INVENTION

The object of the present invention is to design a shell of radio telephone in which the drawbacks of the shell structures known in the art have been eliminated and with the aid of which the assembly can easily be automated. The shell of the invention is rapid and rather inexpensive to manufacture and no screws are needed in assembling the product. The shell is made of plastic material, preferably of ABS plastic. However, it is easy to manufacture various modifications from the shell by using an identical module every time as the radio part. The shell of the present invention is intended to be used particularly with the chassis of the radio telephone disclosed in the Finnish patent application No. FI-890543, Nokia-Mobira. The chassis disclosed in said patent application comprises a completed, functional and tested telephone which in the final assembly step is mounted in the shell according to the present invention, and the structure is locked in a very simple and rapid manner.

In an illustrative embodiment of the invention, the shell for the radio includes an integral box-like housing having a planar bottom, two side walls and a first end wall positioned advantageously perpendicularly to the bottom. One of the side walls is provided with an aperture in the region where a cooling rib, which is positioned outside the shell structure of a radio telephone, is tightly disposed against the radio telephone unit. The upper parts of the inner sides of the side walls are provided with L-shaped grooves in which one leg is parallel to the bottom and the other leg is open at the upper edge of the wall. A second end wall is lower in height than the other walls, thus constituting a half wall. In the corner parts against the bottom, the second end wall is provided with apertures, and in the edges of the side walls, close to said corner parts of the second end wall, tongue grooves extend from the upper edge perpendicularly towards the bottom.

A substantially planar cover, of the shape of the bottom, has locking elements on two opposite edges corresponding in number to the number of L-shaped grooves of the side walls, and adapted for fitting into them. A locking part, when inserted into the tongue grooves extending perpendicularly to the bottom, against the second end wall, forms another half wall in conjunction with the second end wall. The locking part is provided with flexible locking tongues, the tips of which are urged into the apertures in the second end wall, thus locking the locking part and the cover to the housing.

BRIEF DESCRIPTION OF THE DRAWING

FIG. 1 is an exploded view in perspective of the plastic shell structure in accordance with the invention, showing a radio chassis for enclosure within said shell structure.

FIG. 2 is a partial top view, to an enlarged scale, of the base of the plastic shell structure in accordance with the invention.

DESCRIPTION OF THE PREFERRED EMBODIMENT

The embodiment of the invention is described more in detail referring to the FIG. 1, in which the radio telephone module of the above-mentioned Finnish patent application No. FI-890543, Nokia-Mobira, is indicated by reference numeral 2, and by reference numerals 1, 3 and 4, the shell of the invention intended for the module is indicated.

A box-like part or base 1 comprises an even, integral bottom 9, side walls 7, 8 and end walls 5, 6 perpendicularly positioned relative to the base thereto. The side wall 8 is provided with an aperture 10 which is required for mounting a radio module in the plastic shell. The object of the aperture is furthermore to determine the location of the radio module in relation to the plastic shell. The wall 5 extends from the bottom 9 only a small distance, thus constituting a half-wall which is provided with semiarcuate notches in the top edge. The notches are intended for the fixing elements (not shown) of the radio telephone module 2.

The corners defined by the intersections of the wall 5 with the walls 7, 8 provide surfaces 16 that extend to the bottom 9 and upward toward the level of the top edges of the walls 6, 7, 8, but leaving a corner notch. Near the ends of the sidewalls 7, 8 that intersect perpendicularly with the end wall 5, groove 20 (FIG. 2) is provided in each wall 7, 8 that extend perpendicularly from the top edge of the walls 7, 8 to the bottom 9.

A number of L-shaped grooves 11 are provided at the top edges of the side walls 7, 8 on the inside surfaces of said walls. One leg of each L-shaped groove 11 is generally parallel with the bottom 9 and located a short distance from the top edge of the wall 7, 8. The other leg of each L-shaped groove extends to the upper edge of the walls 7, 8, respectively, that is, generally perpendicular to the bottom 9. Additionally, an inner ledge is provided at the upper edges of the walls 6, 7, 8, the depth of the ledge from the upper wall edges being equal to the thickness of the cover 3.

The cover 3 is an integral planar sheet with dimensions corresponding roughly to the dimensions of the bottom 9, the number and spacing of the L-shaped grooves of the side walls being equal to the number and spacing of locking elements 13 provided in cover 3. One part of the locking element is directed perpendicularly from the plane of the cover 3 and the other part forms, as an extension to the former and at a 90 degree angle thereto, the other branch of the locking element, which, in the direction of the cover plane, is projects outwards. The locking elements are positioned on two opposite sides of the cover 3 with spacings therebetween to correspond with the L shaped grooves of the walls 7, 8.

The third part of the shell structure constitutes a locking part 4 which is approximately of the breadth of the wall 5 and the height or the distance from the upper edge of the wall 5 to the level determined by the upper edges of the walls 6,7 and 8. One edge of the locking part 4 is provided with a plurality of semicircular notches which together with the equivalent notches of wall 5 define circular apertures for the connecting elements. It is obvious that the shape and number of said apertures is in no way essential from the point of view of the invention. From the locking part 4, in the direction of its plane, extend two parallel flexible locking tongues 15, provided with thicker parts at their tip ends 17. The thickness of the locking part at the locking tongues is the same as the width of the grooves extending to to the bottom 9 in the corners defined by the walls 7 and 8 with the wall 5.

In assembling a radio telephone, the radio telephone module is enclosed in the plastic shell of the invention in the following manner. The module 2 is disposed in the box-like part 1 in that the cooling rib remains outside the plastic shell. The cooling rib is therefore, fixed to the radio module 2 only in the region of the width of the aperture 10.

The end sections of the rib are loose from the surface of the module so that when the module 2 is disposed in the plastic shell, the area surrounding the aperture 10 of the wall 8 in positioned between the cooling rib and the module 2. The attaching groove 14 shown in the figure is provided for a screw element and it is needed when the assembled radio telephone 2 is mounted on its base (not shown. Thereafter the cover 3 is positioned on top of the inner laps of the walls 6, 7, 8 in that the locking elements 13 are placed at the L shaped grooves 11 of the walls 7 and 8. The cover 3 is now made to slide with a small longitudinal movement away from the wall 5 so that the locking elements 13 slide along the grooves 11, which are general parallel to the bottom 9.

The cover 3 is prevented from opening as to movement toward wall 5 sliding by means of fixing a locking part 4 which is fixed to wall 5. This part is inserted into the grooves in the corners defined by intersection of the walls 7 and 8 with the wall 5. The flexible locking tongues 15 slide against the inner surface of the wall 5, and finally, the thick parts on their tip ends 17 arrive at apertures 12 and are urged into said apertures, whereby locking takes place. The locking piece part 4 is fastened to the upper edge of the wall 5, and prevents the movement of the cover 3.

If one wants to detach the radio module e.g. for maintenance, the thick parts of the tip ends of the locking tongues 15 disposed in the apertures 12 are depressed with a tool and at the same time, the locking part 4 is pulled out of the grooves. The cover 3 is detached with one movement toward side 5, and the radio module is made to slide out as the wall 8 slides out from between the cooling fin and the module 2. Both mounting and discharging are easy to accomplish, and no screw attachments are required.

With the shell of the invention one and the same radio module can be enclosed into different shells. The fixing needs no screws. Savings in costs are gained because of the shortening of the assembly time and of the low price of the plastic body components. Automation is easier in comparison with an aluminium chassis which is implemented with screw joints. If the chassis becomes damaged, it is easy and fast to replace it with a new one. If necessary, various flexible tongues can be made on the walls 5, 6, 7, 8 in the manufacturing step for securing the radio module against movement.

What is claimed is:

1. A shell for a radio telephone, wherein a radio telephone unit may be disposed in a final assembly step, comprising:
    an integral box-like base having a planar bottom, two side walls and two end walls, said walls being positioned perpendicularly to said bottom, said two side walls and one of said end walls being of equal height, the other end wall being lower in height, apertures being provided in said other end wall at the ends thereof near the intersections with said side walls, upper portions of the insides of said two side walls being provided with L-shaped grooves having intersecting legs, one of said legs being oriented substantially parallel to said planar bottom and the other said leg opening toward the upper edge of the associated side wall, a groove provided in each of said side walls perpendicular to said bottom and near said intersections with said other end wall;
    a substantially planar cover similar in shape to said planar bottom, two opposite edges of said cover being provided with locking elements, the number and location of said locking elements corresponding with the number and location of said L-shaped grooves of said side walls;
    a locking part for insertion into said grooves, said locking part including flexible locking tongues having enlarged tip ends, said tip ends being engaged in said apertures of said other end wall when said shell is assembled, said cover being locked to said base by respective engagement of said locking elements on said cover with said L-shaped grooves, said cover being further locked to said base by the locked presence of said locking part.

2. A shell as in claim 1, wherein at least one of said base, said cover and said locking part are made of plastic material.

3. A shell as in claim 2, wherein said plastic material is ABS plastic.

4. A shell as in claim 1, wherein said side walls and said one end wall include an inner ledge adjacent their respective upper edges, the depth of said ledge below said upper edges being equal to the thickness of said cover.

5. A shell as in claim 1, wherein interconnection of said cover locking elements with said L-shaped side wall grooves and engagement of said locking part tongues with said apertures forms a intergrally locked structure, said structure being subject to disassembly by application of external force to said tongues, said tongues being accessible for application of said external force through said apertures in said other end wall.

6. A shell as in claim 1, wherein said other end wall is approximately half the height of said side walls and said one end wall.

7. A shell for a radio telephone, wherein a radio telephone unit may be disposed in a final assembly step, comprising:

an integral box-like base having a planar bottom, two side walls and two end walls, said walls being positioned perpendicularly to said bottom, apertures being provided in one said end wall at the ends thereof near the intersections with said side walls, upper portions of the insides of said two side walls being provided with L-shaped grooves having intersecting legs, one of said legs being oriented substantially parallel to said planar bottom and the one said leg opening toward the upper edge of the associated side wall, a groove provided in each of said side walls perpendicular to said bottom and near said intersections with said one end wall;

a substantially planar cover similar in shape to said planar bottom, two opposite edges of said cover being provided with locking elements;

a locking part for insertion into said grooves, said locking part including flexible locking tongues having enlarged tip ends, said tip ends being engaged in said apertures of said one end wall when said shell is assembled, said cover being locked to said base by respective engagement of said locking elements on said cover with said L-shaped grooves, said cover being further locked to said base by the locked presence of said locking part.

8. A shell as in claim 7, wherein said side walls and the other said end wall include an inner ledge adjacent their respective upper edges, the depth of said ledge below said upper edges being equal to the thickness of said cover.

* * * * *